(12) United States Patent
Huang et al.

(10) Patent No.: US 7,569,425 B2
(45) Date of Patent: Aug. 4, 2009

(54) METHOD FOR MANUFACTURING THERMAL INTERFACE MATERIAL WITH CARBON NANOTUBES

(75) Inventors: Hua Huang, Beijing (CN);
Chang-Hong Liu, Beijing (CN);
Shou-Shan Fan, Beijing (CN)

(73) Assignees: Tsinghua University, Beijing (CN);
Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 333 days.

(21) Appl. No.: 11/592,767

(22) Filed: Nov. 3, 2006

(65) Prior Publication Data
US 2007/0059864 A1 Mar. 15, 2007

Related U.S. Application Data

(62) Division of application No. 11/024,513, filed on Dec. 29, 2004, now Pat. No. 7,253,442.

(30) Foreign Application Priority Data

Apr. 2, 2004 (CN) ......................... 2004 1 0026778

(51) Int. Cl.
*H01L 21/44* (2006.01)
*H01L 21/50* (2006.01)
(52) U.S. Cl. ................. 438/122; 257/77; 257/E23.011; 977/712
(58) Field of Classification Search ................. 438/122; 257/77, E23.011; 977/712
See application file for complete search history.

(56) References Cited

U.S. PATENT DOCUMENTS

| 6,350,488 | B1 | 2/2002 | Lee |
| 6,407,922 | B1 | 6/2002 | Eckblad |
| 2003/0117770 | A1 | 6/2003 | Montgomery et al. |
| 2004/0097635 | A1 | 5/2004 | Fan |

FOREIGN PATENT DOCUMENTS

TW 200427961 A 12/2004

OTHER PUBLICATIONS

Sa Vas Berber, Young-Kyun Kwon, and David Tomanek; Unusually High Thermal Conductivity of Carbon Nanotubes; p. 4613, vol. 84, Physical Review Letters 2000.
Shoushan Fan, Michael G. Chapline, Nathan R. Franklin, Thomas W. Tombler, Alan M. Cassell, and Hongjie Dai; Self-Oriented Regular Arrays of Carbon Nanotubes and Their Field Emission Properties; pp. 512-514, vol. 283, Science 1999.
Liang Liu and Shoushan Fan; Isotope Labeling of Carbon Nanotubes and Formation 12C-13C Nanotubes Junctions; pp. 11502-11503, vol. 123, J. Am. Chem. Soc. 2001.

*Primary Examiner*—Fernando L Toledo
(74) *Attorney, Agent, or Firm*—D. Austin Bonderer

(57) ABSTRACT

A method for manufacturing a thermal interface material includes the steps of: (a) forming an array of carbon nanotubes on a substrate; (b) submerging the carbon nanotubes in a liquid macromolecular material; (c) solidifying the liquid macromolecular material; and (d) cutting the solidified liquid macromolecular material, to obtain the thermal interface material with the carbon nanotubes secured therein.

12 Claims, 1 Drawing Sheet

METHOD FOR MANUFACTURING THERMAL INTERFACE MATERIAL WITH CARBON NANOTUBES

RELATED APPLICATIONS

This application is a division application of U.S. patent application Ser. No. 11/024,513, entitled "THERMAL INTERFACE MATERIAL WITH CARBON NANOTUBES", filed on Dec. 29, 2004, the content of which is hereby incorporated by reference thereto.

BACKGROUND

1. Field of the Invention

The invention relates generally to methods for manufacturing thermal interface materials; and, more particularly, to a method for manufacturing a thermal interface material which conducts heat by using carbon nanotubes.

2. Discussion of Related Art

Electronic components such as semiconductor chips are becoming progressively smaller, while at the same time heat dissipation requirements thereof are increasing. Commonly, a thermal interface material is utilized between the electronic component and a heat sink in order to efficiently dissipate heat generated by the electronic component.

A conventional thermal interface material is made by diffusing particles with a high heat conduction coefficient in a base material. The particles can be made of graphite, boron nitride, silicon oxide, alumina, silver, or other metals. However, a heat conduction coefficient of the thermal interface material is now considered to be too low for many contemporary applications, because it cannot adequately meet the heat dissipation requirements of modern electronic components.

A new kind of thermal interface material has recently been developed. The thermal interface material is obtained by fixing carbon fibers with a polymer. The carbon fibers are distributed directionally, and each carbon fiber can provide a heat conduction path. A heat conduction coefficient of this kind of thermal interface material is relatively high. However, the heat conduction coefficient of the thermal interface material is inversely proportional to a thickness thereof, and the thickness is required to be greater than 40 micrometers. In other words, the heat conduction coefficient is limited to a certain value corresponding to a thickness of 40 micrometers. The value of the heat conduction coefficient cannot be increased, because the thickness cannot be reduced.

An article entitled "Unusually High Thermal Conductivity of Carbon Nanotubes" and authored by Savas Berber (page 4613, Vol. 84, Physical Review Letters 2000) discloses that a heat conduction coefficient of a carbon nanotube can be 6600 W/mK (watts/milliKelvin) at room temperature.

U.S. Pat. No. 6,407,922 discloses another kind of thermal interface material. The thermal interface material is formed by injection molding and has a plurality of carbon nanotubes incorporated in a matrix material. A first surface of the thermal interface material engages with an electronic device, and a second surface of the thermal interface material engages with a heat sink. The second surface has a larger area than the first surface, so that heat can be uniformly spread over the larger second surface.

However, the thermal interface material formed by injection molding is relatively thick. This increases a bulk of the thermal interface material and reduces its flexibility. Furthermore, the carbon nanotubes are disposed in the matrix material randomly and multidirectionally. This means that heat does not necessarily spread uniformly through the thermal interface material. In addition, the heat does not necessarily spread directly from the first surface engaged with the electronic device to the second surface engaged with the heat sink.

A method for manufacturing a thermal interface material which overcomes the above-mentioned problems is desired.

SUMMARY

Accordingly, an object of the present method is to provide a method for manufacturing a thermal interface material having a reduced thickness, small thermal interface resistance, good flexibility, and excellent heat conduction.

To achieve the above-mentioned object, a method for manufacturing a thermal interface material comprises the steps of:

(a) forming an array of carbon nanotubes on a substrate;

(b) submerging the carbon nanotubes in liquid macromolecular material;

(c) solidifying the liquid macromolecular material; and (d) cutting the solidified macromolecular material to obtain the thermal interface material with the carbon nanotubes secured therein.

Unlike in a conventional thermal interface material, the carbon nanotubes of the thermal interface material manufactured by the present method are disposed in the macromolecular material uniformly and directionally. Thus, each carbon nanotube of the thermal interface material can provide a heat conduction path in a direction perpendicular to a main heat-absorbing surface of the thermal interface material. This ensures that the thermal interface material has a high heat conduction coefficient. Furthermore, the thickness of the present thermal interface material can be controlled by cutting the macromolecular material. This further enhances the heat conducting efficiency of the thermal interface material and reduces the volume and weight of the thermal interface material. Moreover, each carbon nanotube is open at two ends thereof, and extends from the first surface to the second surface of the thermal interface material. This ensures the carbon nanotubes can contact an electronic device and a heat sink directly. Thus, the thermal interface resistance between the carbon nanotubes and the electronic device is reduced, and the thermal interface resistance between the carbon nanotubes and the heat sink is reduced. Therefore, the heat conducting efficiency of the thermal interface material is further enhanced.

Other objects, advantages and novel features of the invention will become more apparent from the following detailed description when taken in conjunction with the accompanying drawings.

DETAILED DESCRIPTION OF PREFERRED EMBODIMENTS

Figure 1:
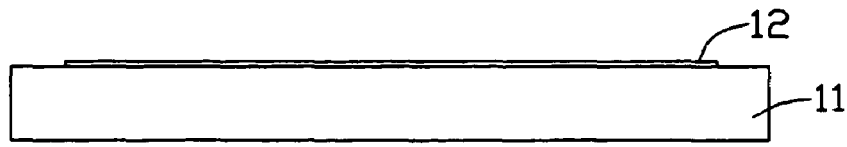
FIG. 1 is a schematic side elevation of a substrate having a catalyst film attached thereon according to the present method and resulting thermal interface material.
Figure 2:
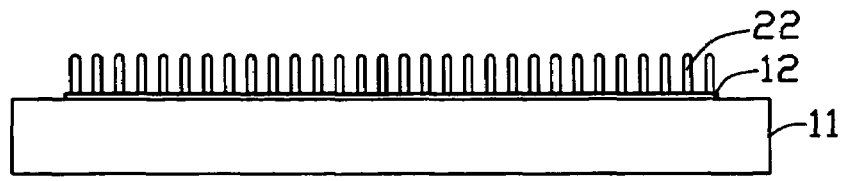
FIG. 2 is similar to FIG. 1, but showing an array of carbon nanotubes directionally formed on the substrate.

Referring to FIG. 1, a substrate 11 having a catalyst film 12 attached thereon is shown. In FIG. 2, an array of carbon nanotubes 22 directionally formed on the substrate 11 is shown. The carbon nanotubes 22 are manufactured by way of thermal chemical vapor deposition or plasma enhanced chemical vapor deposition. In a preferred method of the present invention, the carbon nanotubes 22 are manufactured as follows. Firstly, the substrate 11 is provided. The substrate 11 can be made of glass, quartz, silicon, or alumina. In the preferred embodiment, the substrate 11 is made of porous silicon. A surface of the porous silicon is a porous layer. Diameters of apertures in the porous layer are extremely small, generally about 3 nanometers. Then the catalyst film 12 is uniformly disposed on the substrate 11 by chemical vapor deposition, thermal disposition, electron-beam disposition, or sputtering. The catalyst film 12 can be made of iron (Fe), cobalt (Co), nickel (Ni), or an alloy thereof. In the preferred embodiment, the catalyst film 12 is made of iron.

Secondly, the catalyst film 12 is oxidized to obtain catalyst particles (not shown). Then, the substrate 11 with the catalyst particles disposed thereon is placed in a reaction furnace (not shown), and a carbon source gas is provided in the reaction furnace at a temperature of 700-1000° C. to grow the array of carbon nanotubes 22. The carbon source gas can be acetylene or ethene. A height of the array of carbon nanotubes 22 can be controlled by controlling the growth time thereof. Details of the method for growing the array of carbon nanotubes 22 can be found in pages 512-514, Vol. 283, Science 1999, and in pages 11502-11503, Vol. 123, J. Am. Chem. Soc. 2001. Moreover, U.S. Pat. No. 6,350,488 discloses a method for mass synthesis of arrays of carbon nanotubes. These three publications are incorporated herein by reference.

Figure 3:
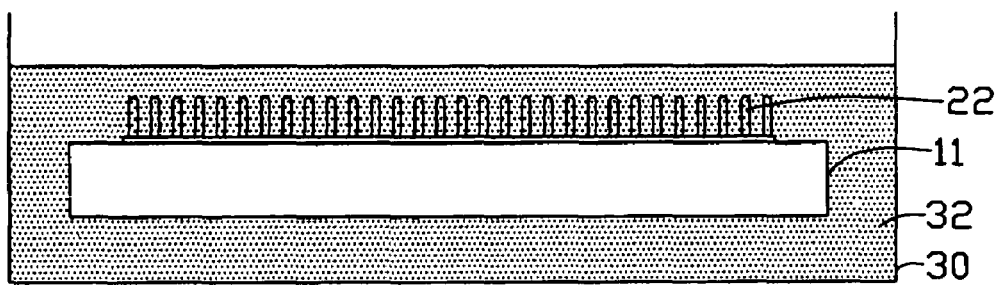
FIG. 3 is similar to FIG. 2, but showing the substrate with the carbon nanotubes immersed in a liquid macromolecular material.

FIG. 3 shows the carbon nanotubes 22 with the substrate 11 immersed in a container 30 of liquid macromolecular material 32. That is, after the growth of the carbon nanotubes 22 is completed, the liquid macromolecular material 32 is provided in order to completely immerse the carbon nanotubes 22 therewithin. The liquid macromolecular material 32 is selected from the group consisting of resin, silicone rubber, and rubber. In the preferred embodiment, the liquid macromolecular material 32 is silicone rubber. A viscosity of the liquid macromolecular material 32 is required to be below 200 cps (centipoise).

Figure 4:
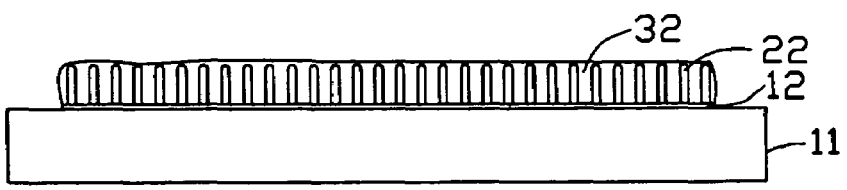
FIG. 4 is similar to FIG. 3, but showing only the substrate, with the carbon nanotubes on the substrate embedded in solidified macromolecular material.
Figure 5:
FIG. 5 is similar to FIG. 4, but showing only the solidified macromolecular material with the carbon nanotubes embedded therein after the solidified macromolecular material has been cut; that is, the present thermal interface material is shown.

Referring to FIGS. 4 and 5, the substrate 11 having the carbon nanotubes 22 immersed in the liquid macromolecular material 32 is taken out of the container 30. Then, the liquid macromolecular material 32 is cooled and solidified. The solidified macromolecular material 32, with the carbon nanotubes 22 secured therein, is peeled off from the substrate 11 and is immersed in liquid paraffin. Then, the liquid paraffin is cooled and solidified. The solidified paraffin has high rigidity, which ensures that the solidified macromolecular material 32 when cut has highly even surfaces. A top portion of the solidified macromolecular material 32 is cut by a cutter (not shown) in a direction perpendicular to the long axes of the carbon nanotubes 22 and at a predetermined elevation thereof. Then a bottom portion of the solidified macromolecular material 32 is cut by the cutter in the same direction at a predetermined elevation. Finally, the solidified paraffin is removed by a suitable solvent, such as xylene, to thereby obtain a thermal interface material 40.

In alternative methods, the liquid macromolecular material 32 can be cooled and solidified while the substrate 11 having the carbon nanotubes 22 remains in the container 30. Then, the substrate 11, having the carbon nanotubes 22 secured in the solidified macromolecular material 32, is taken out of the container 30. Further, the solidified macromolecular material 32, with the carbon nanotubes 22 secured therein, can be peeled off from the substrate 11 after the cutting of the top portion of the solidified macromolecular material 32. In such a case, the solidified macromolecular material 32, with the carbon nanotubes 22 secured therein, is immersed in liquid paraffin twice: once before the cutting of the top portion of the solidified macromolecular material 32, and a second time before the cutting of the bottom portion of the solidified macromolecular material 32.

Detailedly, the cutting process is performed as follows. Firstly, the top portion of the solidified macromolecular material 32 is cut by the cutter in the direction perpendicular to the long axes of the carbon nanotubes 22. This removes the solidified macromolecular material 32 upon the carbon nanotubes 22, so that each carbon nanotube 22 is open at a top end thereof. Secondly, the bottom portion of the cut macromolecular material 32 is cut by the cutter in the same direction in order that the thermal interface material 40 has a predetermined thickness. Thus, each carbon nanotube 22 is open at a bottom end thereof. The thickness of the thermal interface material 40 is preferably in the range from 1 to 1000 micrometers. In the preferred embodiment, the thickness of the thermal interface material 40 is 20 micrometers.

FIG. 5 shows the present thermal interface material 40 in isolation. The thermal interface material 40 comprises the solidified macromolecular material 32, and the array of carbon nanotubes 22 is embedded in the solidified macromolecular material 32 uniformly. The thermal interface material 40 has a first surface 42 and a second surface 44 opposite to the first surface 42. The carbon nanotubes 22 are substantially parallel to each other and extend from the first surface 42 to the second surface 44. That is, the carbon nanotubes 22 are perpendicular to the first surface 42 and the second surface 44. Thus, each carbon nanotube 22 can provide a heat conduction path in a direction perpendicular to a selected main heat-absorbing surface of the thermal interface material 40. Therefore, the thermal interface material 40 has a high heat conduction coefficient and can conduct heat uniformly.

Figure 6:
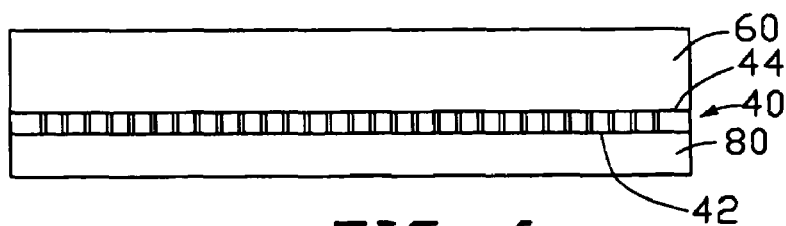
FIG. 6 is similar to FIG. 5, but showing the thermal interface material sandwiched between an electronic device and a heat sink.

FIG. 6 shows an application of the present thermal interface material 40. The thermal interface material 40 is sandwiched between a heat sink 60 and an electronic device 80, to provide good heat contact between the heat sink 60 and the electronic device 80. The first surface 42 of the thermal interface material 40 engages with a surface (not labeled) of the electronic device 80, and the second surface 44 of the thermal interface material 40 engages with a surface (not labeled) of the heat sink 60.

Because solidified paraffin is used in the above-described cutting process, this ensures that the first and second surfaces 42, 44 of the thermal interface material 40 are highly even. In addition, because the thickness of the thermal interface material 40 is on a micron scale, the thermal interface material 40 has good flexibility. Thus, even if the surface of the electronic device 80 is uneven, the thermal interface material 40 can provide good heat contact between the heat sink 60 and the electrical device 80. Furthermore, each carbon nanotube 22 is open at both ends thereof and extends from the first surface 42 to the second surface 44 of the thermal interface material 40. This ensures that the carbon nanotubes 22 contact the electronic device 80 and the heat sink 60 directly. Thus, the thermal interface resistance between the carbon nanotubes 22 and the electronic device 80 is reduced, and the thermal interface resistance between the carbon nanotubes 22 and the heat sink 60 is reduced. Therefore, the heat conducting efficiency of the thermal interface material 40 is further enhanced.

It is understood that the above-described embodiments and methods are intended to illustrate rather than limit the invention. Variations may be made to the embodiments and methods without departing from the spirit of the invention. Accordingly, it is appropriate that the appended claims be construed broadly and in a manner consistent with the scope of the invention.

We claim:

1. A method for manufacturing a thermal interface material, the method comprising the steps of:
    (a) forming an array of carbon nanotubes on a substrate;
    (b) applying a liquid macromolecular material to the carbon nanotubes;
    (c) solidifying the liquid macromolecular material; and
    (d) cutting the solidified macromolecular material in a direction perpendicular to the long axes of the carbon nanotubes, to thereby obtain the thermal interface material with the carbon nanotubes secured therein.

2. The method as claimed in claim 1, wherein step (d) comprises the steps of:
    (d1) cutting at least one side of the solidified macromolecular material in the direction perpendicular to long axes of the carbon nanotubes, resulting in a plurality carbon nanotubes being open at one end thereof.

3. The method as claimed in claim 1, wherein step (d) is performed by a cutter.

4. The method as claimed in claim 1, wherein step (b) comprises the following steps before step (d):
    (b1) submerging the solidified macromolecular material in liquid paraffin.

5. The method as claimed in claim 1, further comprising a step (e) comprises of peeling the solidified macromolecular material, with the carbon nanotubes secured therein, off from the substrate before cutting.

6. The method as claimed in claim 1, wherein the macromolecular material is selected from the group consisting of a resin, silicone rubber, and rubber.

7. The method as claimed in claim 1, wherein a viscosity of the liquid macromolecular material is below 200 cps (centipoises).

8. The method as claimed in claim 1, wherein step (a) is performed by way of thermal chemical vapor deposition or plasma enhanced chemical vapor deposition.

9. The method as claimed in claim 1, wherein the substrate is made of porous silicon.

10. The method as claimed in claim 9, wherein the porous silicon has a surface of porous layer.

11. The method as claimed in claim 4, further comprising a step of removing the solidified paraffin by using a suitable solvent.

12. The method as claimed in claim 11, wherein the suitable solvent is xylene.

* * * * *